(12) United States Patent
Mikolajick et al.

(10) Patent No.: US 7,272,040 B2
(45) Date of Patent: Sep. 18, 2007

(54) MULTI-BIT VIRTUAL-GROUND NAND MEMORY DEVICE

(75) Inventors: Thomas Mikolajick, Dresden (DE); Josef Willer, Riemerling (DE); Corvin Liaw, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/119,376

(22) Filed: Apr. 29, 2005

(65) Prior Publication Data

US 2006/0245233 A1 Nov. 2, 2006

(51) Int. Cl.
*G11C 11/34* (2006.01)

(52) U.S. Cl. ............... 365/185.03; 365/185.16; 365/185.17; 365/185.29

(58) Field of Classification Search ........... 365/185.03, 365/185.17, 185.29, 185.33, 185.28
See application file for complete search history.

(56) References Cited

U.S. PATENT DOCUMENTS

| | | | | |
|---|---|---|---|---|
| 5,754,469 A * | 5/1998 | Hung et al. | ............ | 365/185.03 |
| 5,768,192 A | 6/1998 | Eitan | | |
| 6,011,725 A * | 1/2000 | Eitan | ............ | 365/185.33 |
| 6,172,912 B1 * | 1/2001 | Hirano et al. | ............ | 365/185.03 |
| 6,324,099 B1 | 11/2001 | Iijima | | |
| 6,353,554 B1 * | 3/2002 | Banks | ............ | 365/185.03 |
| 6,373,746 B1 * | 4/2002 | Takeuchi et al. | ............ | 365/185.03 |
| 6,459,622 B1 * | 10/2002 | Ogura et al. | ............ | 365/185.03 |
| 6,678,191 B2 * | 1/2004 | Lee et al. | ............ | 365/185.17 |
| 6,747,899 B2 * | 6/2004 | Hsia et al. | ............ | 365/185.17 |
| 7,057,939 B2 * | 6/2006 | Li et al. | ............ | 365/185.03 |
| 2003/0080372 A1 | 5/2003 | Mikolajick | | |
| 2003/0148582 A1 | 8/2003 | Willer et al. | | |
| 2003/0161192 A1 | 8/2003 | Kobayashi et al. | | |
| 2003/0185055 A1 | 10/2003 | Yeh et al. | | |
| 2004/0087087 A1 | 5/2004 | Ogura et al. | | |
| 2005/0030769 A1 | 2/2005 | Hsu et al. | | |
| 2005/0104117 A1 | 5/2005 | Mikolajick et al. | | |

OTHER PUBLICATIONS

Yeh, C.C., et al., "PHINES: A Novel Low Power Program/Erase, Small Pitch, 2-Bit per Cell Flash Memory," 2002 IEEE, 4 pages.
Willer, J., et al., "110nm NROM Technology for Code and Data Flash Products," 2004 IEEE, Symposium on VLSI Technology Digest of Technical Papers, pp. 76-77.

* cited by examiner

*Primary Examiner*—Trong Phan
(74) *Attorney, Agent, or Firm*—Slater & Matsil, L.L.P.

(57) ABSTRACT

An array of charge-trapping multi-bit memory cells is arranged in a virtual-ground NAND architecture. The memory cells are erased by Fowler-Nordheim tunneling of electrons into the memory layers. The write operation is effected by hot hole injection. A write voltage is applied by a bitline to two NAND chains in series. The subsequent bitline on the side of the memory cell to be programmed is maintained on floating potential, whereas the bitline on the other side is set to an inhibit voltage, which is provided to inhibit a program disturb of an addressed memory cell which is not to be programmed. This virtual-ground NAND architecture of charge-trapping memory cells enables an increased storage density.

21 Claims, 9 Drawing Sheets

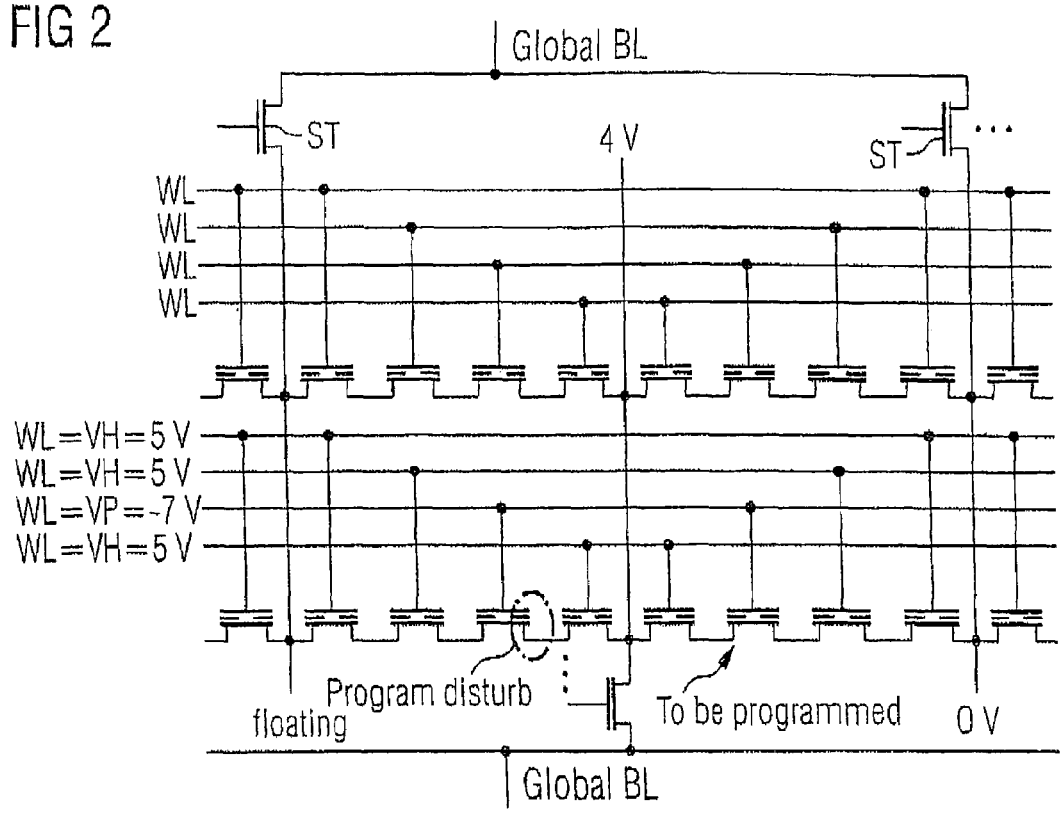

MULTI-BIT VIRTUAL-GROUND NAND MEMORY DEVICE

TECHNICAL FIELD

This invention concerns virtual-ground NAND memory devices comprising multi-bit charge-trapping memory cells.

BACKGROUND

Charge-trapping memory devices, which comprise a memory layer sequence of dielectric materials provided for charge-trapping to program the memory cell, especially SONOS (silicon oxide nitride oxide silicon) memory cells comprising oxide-nitride-oxide layer sequences as storage medium, are usually programmed by channel hot electron injection. Charge-trapping memory cells can be structured to enable the storage of two bits of information in each memory cell. U.S. Pat. No. 5,768,192 and U.S. Pat. No. 6,011,725, both of which are incorporated herein by reference, disclose charge-trapping memory cells of a special type of so-called NROM (nitride read only memory) cells, which can be used to store bits of information both at the source and at the drain below the respective gate edges. The programmed cell is read in reverse mode to achieve a sufficient two-bit separation. Erasure is performed by hot hole injection. Further multi-bit charge-trapping memory devices are disclosed in U.S. Patent Application Publication Nos. 2003/0080372 A1 (application Ser. No. 10/283,856), 2003/0148582 A1 (application Ser. No. 10/093,722), and 2003/0161192 A1 (application Ser. No. 09/735,938), and U.S. Pat. No. 6,324,099 B1, each of which is incorporated herein by reference.

U.S. Patent Application Publication No. 2003/0185055 A1 (application Ser. No. 10/113,356) and a corresponding paper of C. C. Yeh et al., "PHINES: A Novel Low Power Program/Erase, Small Pitch, 2-Bit per Cell Flash Memory", 2002 IEEE, both of which are incorporated herein by reference, disclose a non-volatile semiconductor memory cell with electron-trapping erase state, which operates as flash memory and is able to store two bits. The erasure takes place by Fowler-Nordheim tunneling of electrons from either channel or gate electrode into the storage layer of a conventional charge-trapping layer sequence, for example an ONO (oxide nitride oxide) layer sequence. In programming this memory, electric holes are injected into the non-conducting charge-trapping layer. Hot hole injection can be induced at source and drain, which means, at both ends of the channel. This operating method avoids high programming currents.

As the memory layer of charge-trapping memory cells is electrically insulating material, the trapped charge is confined to the sites of the traps, which may be located at either end of the channel. This means that charge-trapping can take place adjacent to either of the source/drain regions of each memory cell. The programming mechanism is improved if the memory layer is additionally confined to limited regions in the vicinity of the two source/drain regions. In this way, a high density of stored information can be obtained.

A high storage density can also be obtained with an array of floating gate memory cells in a NAND architecture. The floating gate is usually formed of an electrically conductive layer between a control gate electrode and the channel region. The charge carriers that are accumulated on the floating gate electrode in the programmed state of the memory cell are not trapped, but are distributed throughout the floating gate so that the electric field vanishes within the electric conductor.

The shrinkability of 2-bit/cell charge-trapping memory devices is essentially limited by two restrictions. A minimal channel length is necessary in order to enable a sufficiently high source/drain voltage; and the arrangement of self-aligned source/drain contacts between the wordlines requires sufficiently thick insulations to guarantee the demanded voltage. An arrangement of charge-trapping memory cells in a NAND array would render an even higher storage density than previous virtual-ground arrays. Therefore, a reduction of the device area would be possible in principle, if the memory cells could be arranged into strings of memory cells. However, this is not actually possible if the usual read/write operation is implemented in the memory device, since the memory cells of a string can only be addressed via further memory cells that are connected in series.

SUMMARY OF THE INVENTION

In one aspect, the present invention presents a charge-trapping memory device, including an array of multi-bit memory cells, that provides a higher storage density than previous virtual-ground arrays.

In a further aspect, this invention discloses an operation mode of the memory device to achieve an appropriate performance of the device.

This multi-bit memory device comprises an array of memory cells being arranged in rows and columns and forming a virtual-ground NAND architecture. The memory cells are charge-trapping memory cells comprising two separate storage sites each, one of the storage sites being located near one of the source/drain connections and the other one of the storage sites being located near the opposite source/drain connection.

The rows of the memory cells are subdivided into groups of preferably the same number of rows. Along the columns, the memory cells are connected in series by their source/drain connections. The source/drain connections that are common to memory cells of two adjacent groups of rows, i.e., the source/drain connections situated between the groups of rows, form a special selection of source/drain connections that are connected by one bitline out of a plurality of bitlines. The bitlines are arranged parallel at a distance from one another along the columns. Wordlines are arranged parallel at a distance from one another transversely to the bitlines along the rows.

Along each column, the source/drain connections of the selection located between the group of rows are connected either alternatingly to one of the bitlines and to a neighboring one of this bitline or sequentially to subsequent bitlines. In this manner, NAND chains of memory cells are formed by memory cells of the same column and the same group of rows between subsequent source/drain connections pertaining to the selection.

Each of the wordlines connects the gate connections of the memory cells of one of the rows. This means that each of the gate connections of the memory cells of one NAND chain is connected to another one of the wordlines that belong to this NAND chain. The NAND chains are preferably of the same length, thus comprising the same number of memory cells.

In a first preferred embodiment, the bitlines are arranged along the columns, preferably essentially straight, and every bitline is connected to the source/drain connections that are common to four memory cells that are arranged in a square and thus belong to two rows and two columns.

A second preferred embodiment comprises bitlines that are arranged in zigzag fashion along the columns. Every bitline is alternatingly connected to source/drain connections of memory cells of one of two neighboring columns.

Another preferred embodiment comprises columns of memory cells in active areas that are arranged in zigzag fashion, while the bitlines can be straight or at least mainly straight. In this embodiment as well, every bitline is alternatingly connected to source/drain connections of memory cells of one of two neighboring columns.

A further preferred embodiment comprises preferably straight bitlines that are arranged parallel at a distance from one another at a small angle to the columns of memory cells. Thus, the columns pass one bitline after another. Along each column, the source/drain connections of the selection are sequentially connected to subsequent bitlines.

An electronic circuit provided for an application of voltages to the memory cells to perform read, write, and erase operations, is preferably provided with means to apply a write voltage to any of the bitlines and an inhibit voltage to a neighboring bitline, which is appropriate to inhibit a write operation at the memory cells belonging to NAND chains that are connected to the neighboring bitline.

Preferred embodiments are provided with select transistors functioning as a switch to enable a connection of every bitline individually to one of two global bitlines. In these embodiments, every second bitline in succession is connected to the first one of the global bitlines by means of the select transistors, and the other bitlines are connected to the other one of the global bitlines.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawing, in which:

FIG. 1. which includes

FIG. 2 shows the circuit scheme according to FIG. 1 with programming voltages of a direct approach to a programming process by hot hole injection;

The following list of reference symbols can be used in conjunction with the figures:
A connection of $BL_m$
AA active area
B connection of $BL_{m+1}$
BC bitline connection
BL bitline
C connection of $BL_{m-1}$
L dimension
MC memory cell
P memory cell pitch
p' bitline pitch
R resistance
R' resistance
SS storage site
ST select transistor
STI shallow trench isolation
$V_i$ inhibit voltage
$V_w$ write voltage
WL wordline

DETAILED DESCRIPTION OF ILLUSTRATIVE EMBODIMENTS

Figure 1A:
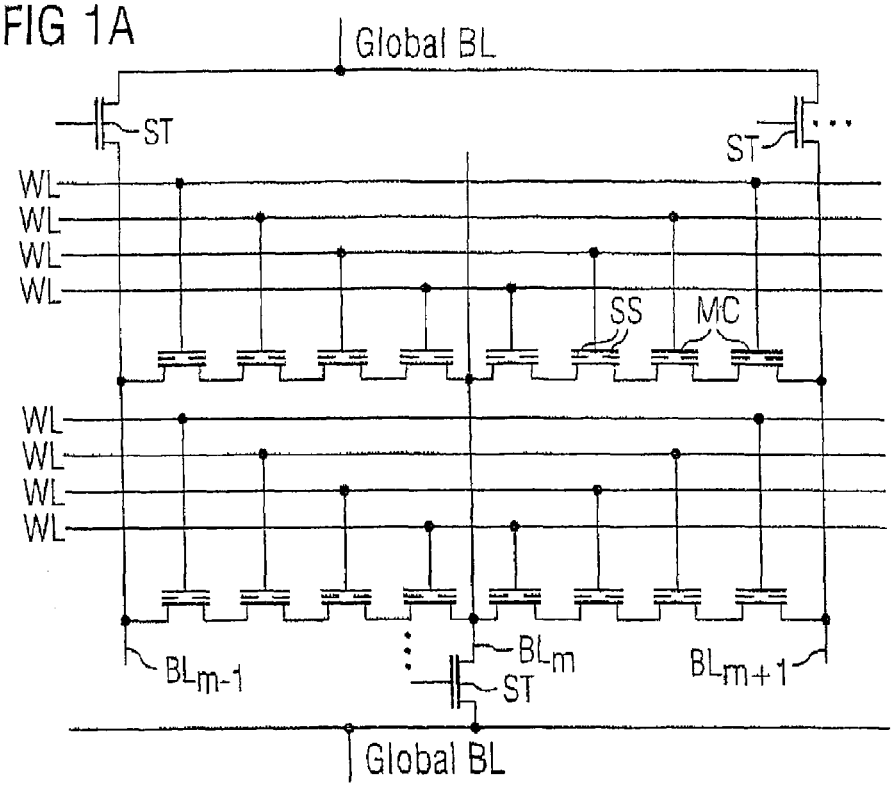
FIG. 1a and 1b, shows a circuit scheme of an embodiment of the inventive memory device.
Figure 1B:
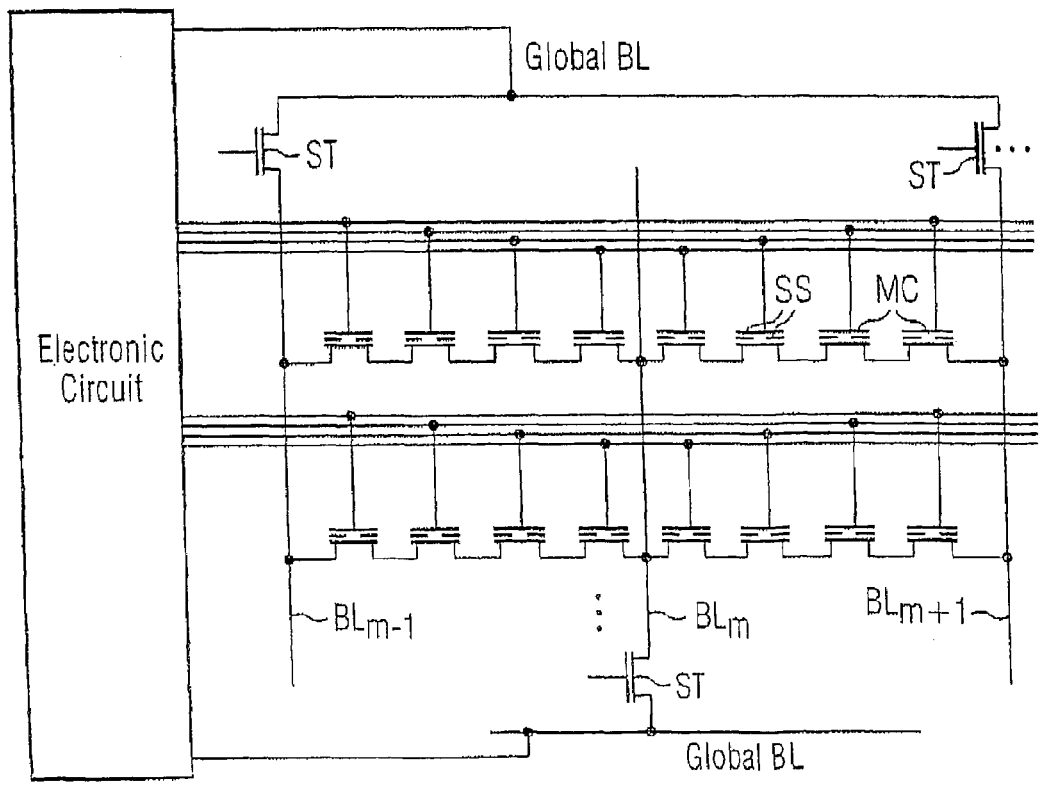

In this memory device, charge-trapping memory cells are arranged and connected as a virtual-ground NAND array. FIG. 1a shows a circuit scheme of a section of a first embodiment. FIG. 1b shows the circuit scheme of FIG. 1a, with an electronic circuit, e.g. write circuit or erase circuit, coupled to the array. This scheme shows a number of memory cells MC that are part of the memory cell array. Every memory cell MC is a charge-trapping memory cell, which comprises two storage sites SS adjacent to both source/drain connections. In FIG. 1, the memory cells are drawn on a horizontal line, which does not represent the actual physical arrangement of the memory cells within the array. The wordlines WL run along the rows of memory cells, and the bitlines BL run along the columns, transversely to the wordlines. The memory cells shown in the section of FIG. 1, which are situated between bitlines $BL_{m-1}$ and $BL_m$, all belong to the same column of memory cells. Their sequence along the column can be inferred from their connections to the drawn wordlines. The bitlines are connected to either of two global bitlines by means of selection transistors ST. The memory cells are connected in series between the connections to two neighboring bitlines. In this example, every NAND chain comprises four memory cells. The programming is effected by hot hole injection, because the source/drain voltage of the memory cells along the series connection is unfavorably low for a conventional channel hot electron injection.

FIG. 2 shows the circuit scheme according to FIG. 1 with the programming voltages inserted. The memory cell and the storage site that is to be programmed are indicated by the arrow on the right side. On the same side as the storage site to be programmed, the write voltage of 4 V is applied to the source/drain connection at the end of the NAND chain. The other end of the NAND chain is set to 0 V. The gate connections are set to a high voltage VH of typically, for example, 5 V, except for the gate connection of the memory cell to be programmed, which is set to the programming voltage VP of typically, for example, −7 V. Although the next bitline $BL_{m+1}$ on the other side is on floating potential, a program disturb is to be expected at the mirror cell of the programmed cell between the write voltage and the floating potential. This problem is avoided by a special operation mode, which is adapted to this memory cell array and will be described in detail in connection with FIG. 4.

Figure 3:
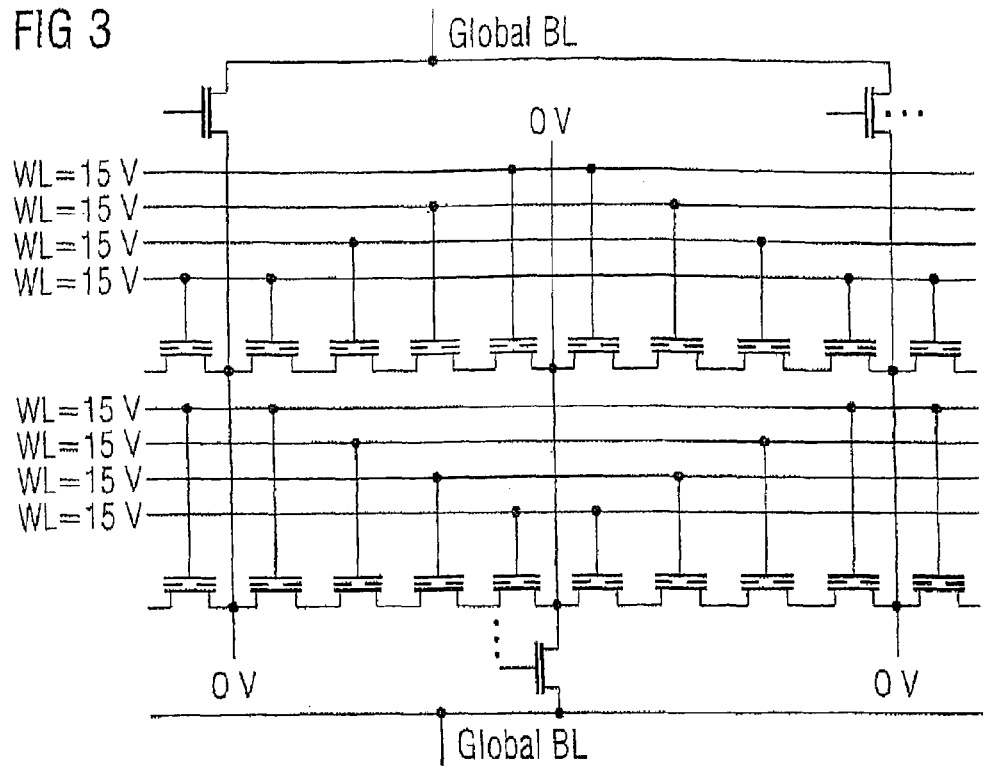
FIG. 3 shows a circuit scheme of a further embodiment of the inventive memory device for the erase operation.

FIG. 3 shows a circuit scheme according to FIG. 1 of another embodiment for the erase operation with the voltages inserted according to the special operation mode. All the wordlines WL are set to a high voltage, typically, for example, 15 V. If a lower voltage, in this example 0 V, is applied to the bitlines and to the substrate, Fowler-Nordheim tunneling of electrons commences from the channel region into the memory layer so that the threshold voltage of the memory transistors is locally increased. When the threshold voltage is sufficiently high, all the memory cells are in a state that is regarded as erasure.

Figure 4:
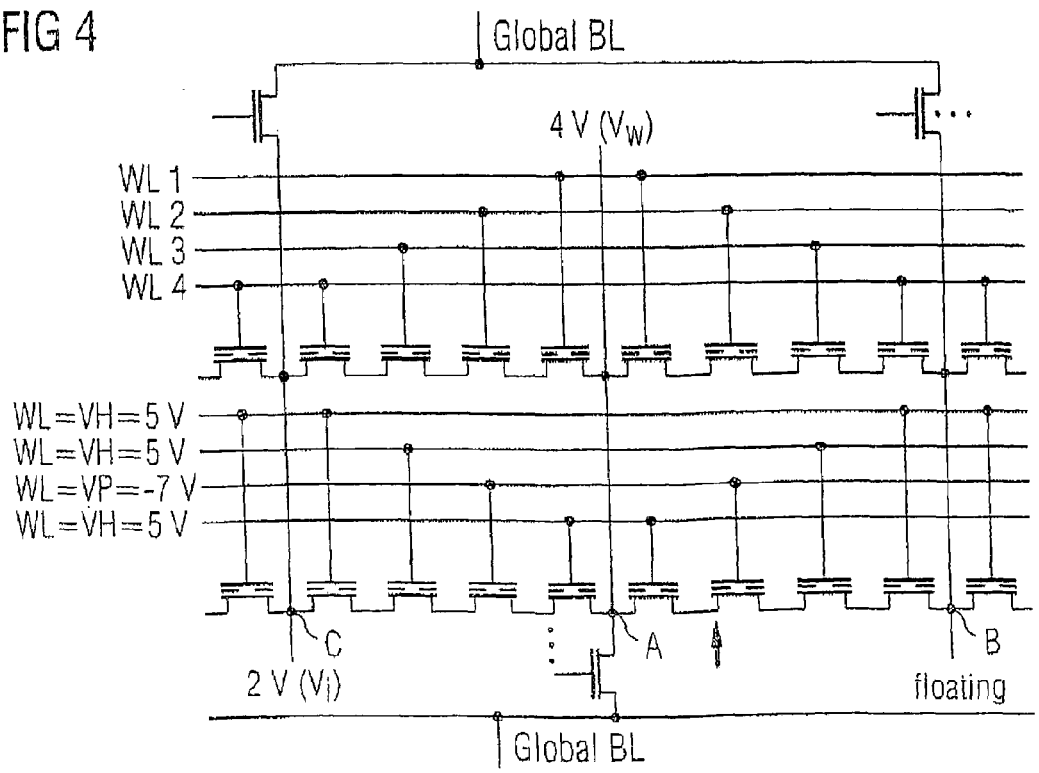
FIG. 4 shows the circuit scheme according to FIG. 3 for the write operation.

FIG. 4 shows the circuit scheme according to FIG. 3 for the write operation. The wordline of the selected cell, which is to be programmed, is set to a suitable negative voltage, the programming voltage VP of typically, for example, −7 V. The other memory cells of this NAND chain are switched open by a suitable positive voltage, for example the high voltage VH of typically 5 V. In order to obtain a hot hole injection, the source/drain connection at the storage site of the selected memory cell, where the programming has to be effected, has to be set to a positive write voltage $V_W$ of typically, for example, 4 V. Therefore, the bitline that is connected to the source/drain connection A shown in FIG. 4 is set to 4 V if, for instance, the storage site that is indicated by the arrow pointing upwards is to be programmed, while the bitline that is connected to the other end of the NAND chain (connection B) is maintained on floating potential. The floating potential is usually 0 V because the non-addressed bitlines are maintained on 0 V and the write operation is short so that the floating potential does not change essentially during this short time interval. In any case, the potential difference between the source/drain connections of the memory cell that is to be programmed is large enough in order to generate holes by means of the so-called GIDL (gate induced drain leakage) effect. These holes are subsequently injected into the memory layer. This means that the threshold voltage of the selected memory cell is decreased on the relevant side so that the state of the relevant storage site is changed into the programmed state.

If no countermeasures are taken, an undesired programming occurs in the memory cell that is located in a mirror position with respect to the bitline that is set to the write voltage. The undesired write operation is inhibited by the application of an inhibit voltage $V_i$, typically about 2 V, for example, to the next bitline connection C at the other end of the mirror NAND chain. In any case, the inhibit voltage is chosen so that no memory cell of the NAND chains that end at the connection C is programmed. The voltage difference of 2 V between the write voltage $V_w$ and the inhibit voltage $V_i$, and between the inhibit voltage $V_i$ and the floating potential of approximately 0 V is too small to generate a hot hole injection in the memory cells of the NAND chains that end at connection C. The threshold voltages of these memory cells thus remain basically unchanged. By means of the inhibit voltage $V_i$, a program disturb of memory cells that are addressed by the same wordline, but are not to be programmed, can be avoided. This operation mode enables an appropriate operation of the inventive memory cell architecture, thus securing adequate performance even in an array of extremely increased storage density.

Figure 5:
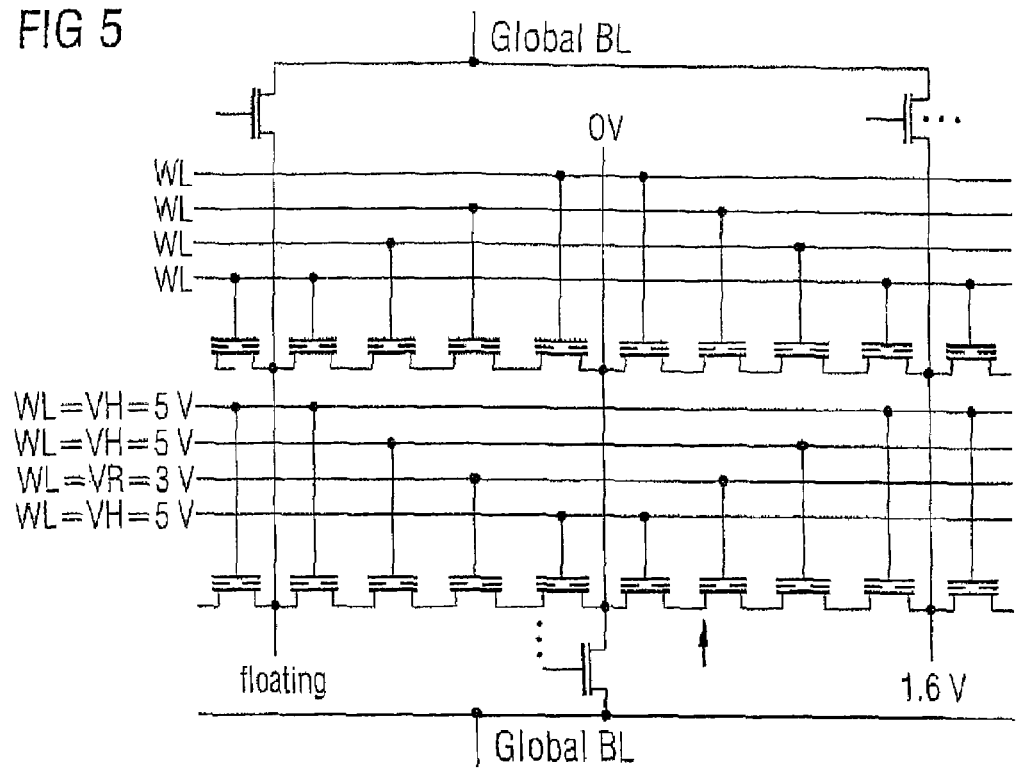
FIG. 5 shows the circuit scheme according to FIG. 3 for the read operation.

The read operation is performed according to the circuit scheme of FIG. 5, which shows the appropriate voltages. The wordline, which addresses the memory cell that is to be read, is set to the read voltage VR of typically, for example, 3 V. The other wordlines of the same NAND chain are set to the high voltage VH of typically, for example, about 5 V. The storage site that is to be read is indicated by the arrow pointing upwards in FIG. 5. The bitline that was set to the write voltage in the programming of this storage site is set to a low potential, typically 0 V, while the bitline at the other end of the NAND chain is set to an appropriate drain voltage of typically, for example, 1.6 V.

Due to the generated space-charge region in the selected memory cell on the side of the drain voltage, the influence of the non-selected storage site of this memory cell is sufficiently small. Therefore, the current through this memory cell is essentially defined by the selected storage site to be read, and can be evaluated to check the programmed state of this storage site and thus to read the stored bit of information. In this way, the two storage sites of the 2-bit charge-trapping memory cells can be distinguished in the read operation.

The typical voltages that are applied in the write and read operations are repeated in the following table for easy reference.

| connection\operation | write | read |
|---|---|---|
| gate of the selected cell | −7 V | 3 V |
| other gates of the selected NAND chain | 5 V | 5 V |
| source/drain of the selected cell, addressed side (A) | 4 V ($V_w$) | 0 V |
| source/drain of the selected cell, non-addressed side (B) | floating (≈0 V) | 1.6 V |
| source/drain of the disturbed cell, side opposite selected cell (C) | 2 V ($V_i$) | floating |
| bulk | 0 V | 0 V |

Figure 6:
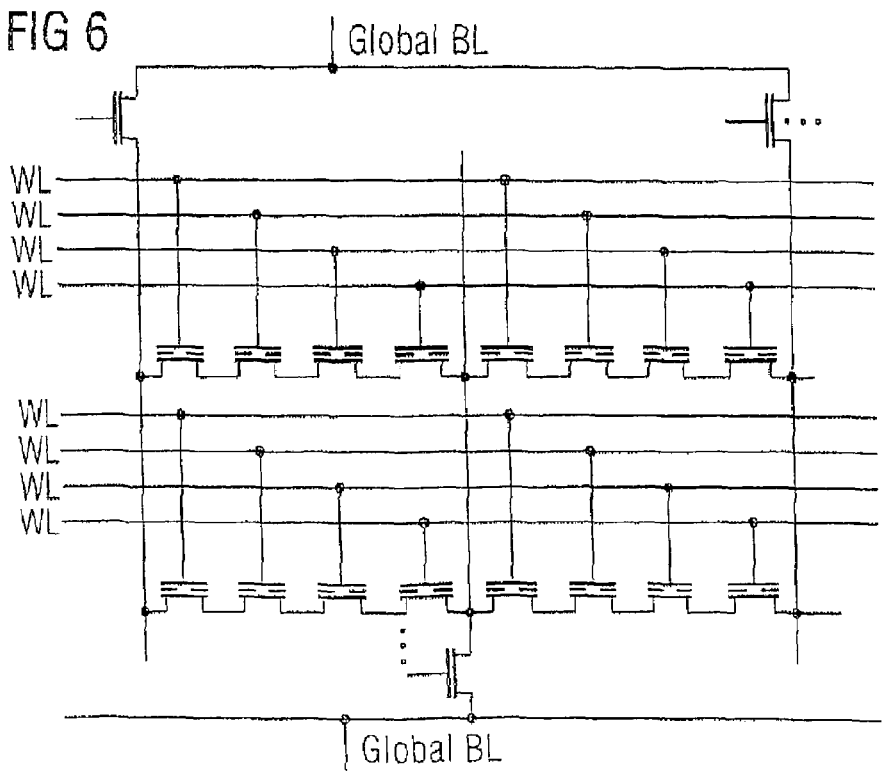
FIG. 6 shows a circuit scheme according to FIG. 1 for another embodiment of the inventive memory device.

FIG. 6 shows the circuit scheme for another embodiment, in which the sequence of the connections of the wordlines is not symmetrical to the bitlines as in the first embodiment. The sequence of connections of the wordlines is repeated after every connection to a bitline. Thus, the sequence of connections is periodical from one bitline to the next one. The operation modes, which have been described in connection with the first embodiment, are applied to this second embodiment in a corresponding way. The applied voltages can be the same; only the location of the memory cell in which a program disturb would occur if no inhibit voltage were applied is changed.

Figure 7:
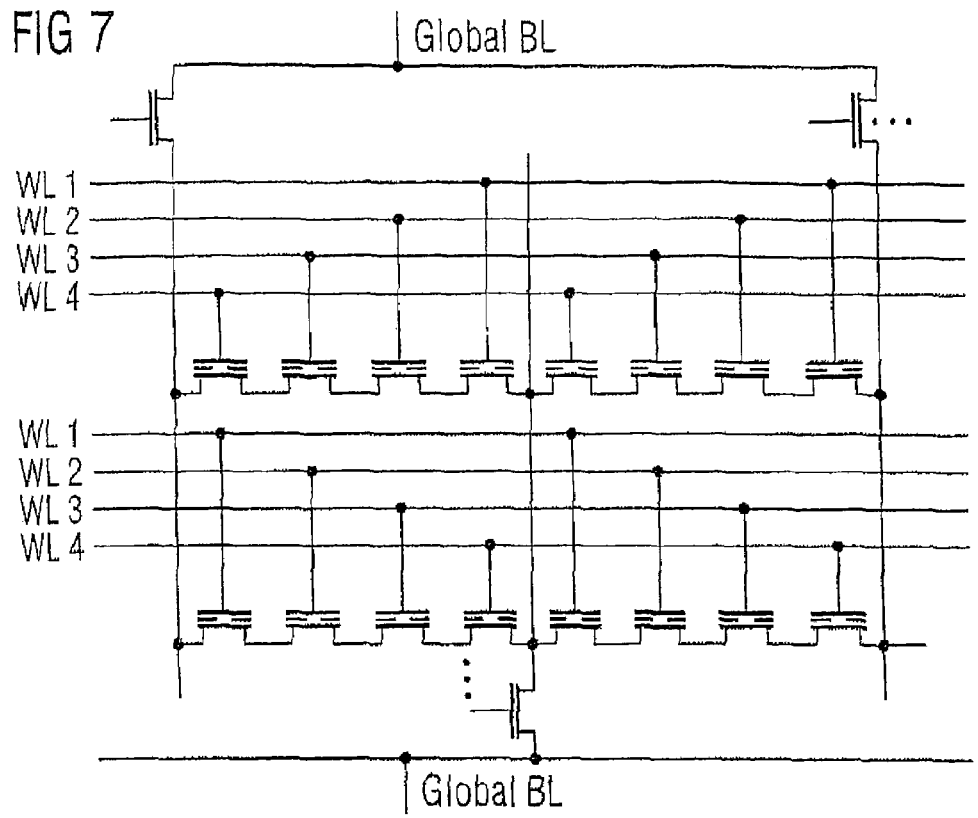
FIG. 7 shows a circuit scheme according to FIG. 1 for still another embodiment of the inventive memory device.

FIG. 7 shows the circuit scheme for another embodiment in which the sequence of connections of the wordlines is repeated after every connection to a bitline. This embodiment differs from the embodiment according to FIG. 6, which will become apparent from the following description of the plan views of exemplary device structures.

Figure 8:
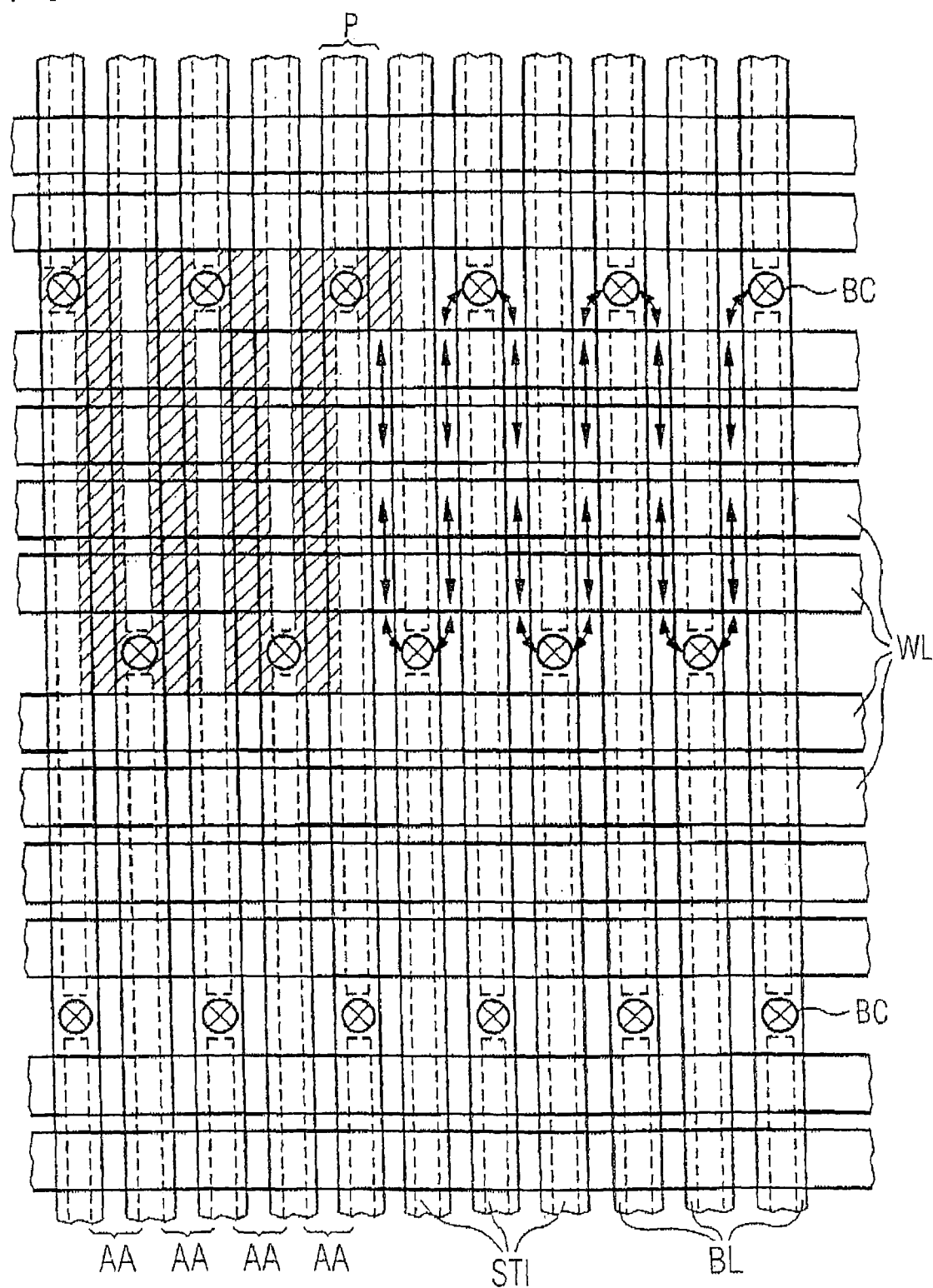
FIG. 8 is a plan view of an embodiment of the inventive memory device according to the circuit scheme of FIG. 4, showing the arrangement of the NAND chains, bitlines and wordlines.

FIG. 8 is a plan view of an embodiment of the memory device according to the circuit scheme of FIG. 3. It shows the arrangement of the NAND chains, the bitlines and the wordlines in a schematic fashion. The memory cells are arranged in active areas AA of the substrate, which are separated by shallow trench isolations STI. The boundaries of the shallow trench isolations are shown by the parallel broken lines that are in close vicinity. The wordlines WL run along the rows of memory cells and cover essentially the channel regions. The source/drain regions are arranged on both sides of the wordlines, preferably self-aligned. The source/drain regions, which form the source/drain connections of the memory cells, are common to memory cells that are subsequent along the columns. In this way, the memory cells are arranged in series to form the NAND chains between two subsequent bitline connections BC. The bitlines BL run along the columns of memory cells and are arranged parallel at a distance from one another as straight strips. The pitch p of the memory cell array is indicated between the corresponding boundaries of two neighboring bitlines.

The bitline connections BC are arranged in such a manner that every bitline is connected to the source/drain connections that are common to the four adjacent memory cells that are arranged in a square. Along each of the columns, the source/drain connections that are contacted by bitlines are alternatingly connected to the two neighboring bitlines. Every NAND chain in the example shown in FIG. 7 comprises four memory cells, and all NAND chains belong to the same groups of rows, which in this example all comprise four rows and four wordlines. The ends of the NAND chains are also ends of the NAND chains that follow on both sides in the same column. Within the same group of rows, the NAND chains form a sequence of NAND chains, which are connected in series by their common source/drain connections, which are connected by the bitlines. This is highlighted in FIG. 8 by the hatching of a sequence of NAND chains on the left side, which is also indicated by the sequence of double arrows on the right side. This sequence of double arrows corresponds to the arrangement of memory cells that are shown on a straight horizontal line in FIGS. 3 to 5.

Figure 9:
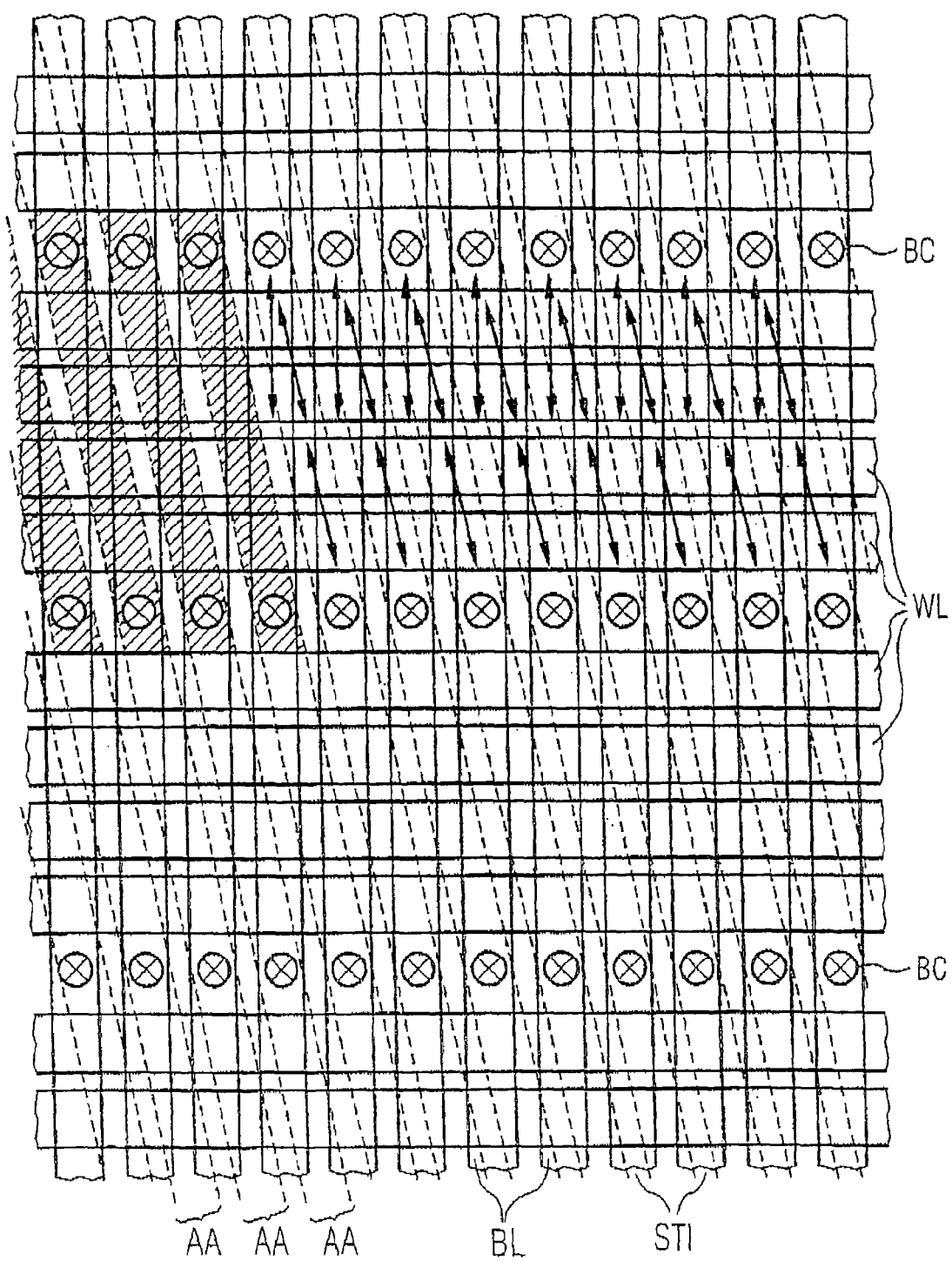
FIG. 9 is a plan view according to FIG. 8 of an embodiment according to the circuit scheme of FIG. 6.

FIG. 9 is a plan view according to FIG. 8 for an embodiment according to the circuit scheme of FIG. 6. The columns of memory cells are arranged in active areas AA at a small angle to the straight bitlines BL, which are arranged transversely to the wordlines WL. Following a column from top to bottom in FIG. 9, the subsequent bitline connections BC connect the source/drain connections of the selection pertaining to the relevant column to subsequent bitlines, following one another from left to right in the example shown in FIG. 9.

Figure 10:
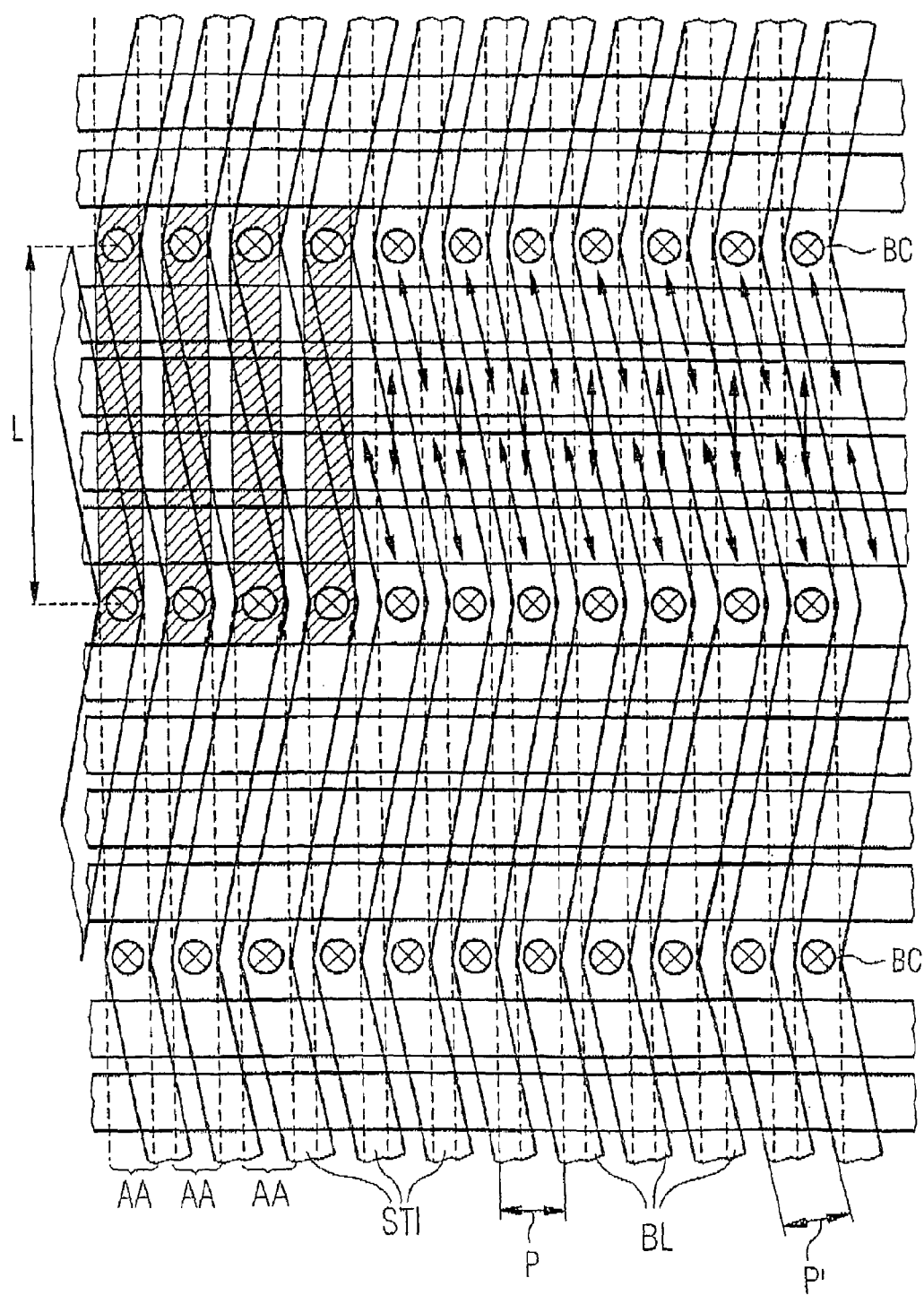
FIG. 10 is a plan view according to FIG. 8 of an embodiment according to the circuit scheme of FIG. 7.

FIG. 10 is a plan view according to FIG. 8 for an embodiment according to the circuit scheme of FIG. 7. In this embodiment, the bitlines BL run in zigzag fashion essentially along the columns. The bitline connections BC along one single bitline are alternatingly connected to the source/drain connections of two adjacent columns of memory cells. The sequence of NAND chains, which are shown on horizontal straight lines in FIG. 6, is again highlighted by the hatching. The source/drain connections at the ends of the NAND chains of this sequence of the second embodiment do not coincide, but are electrically connected by the bitlines. This can be seen from the double arrows on the right side. The double arrows show the sequence of NAND cells, which are arranged along the double arrows that are directed vertically, and which are connected by sections of the bitlines, which are indicated by the slightly tilted double arrows. The pitch p of the memory cell array and the pitch p' of the bitlines are indicated in the FIG. 10, as well as the longitudinal dimension L of the NAND chains along the columns, including proportionate parts of the bitline contacts on the source/drain connections at the ends of the NAND chains.

Since $p'/L$ and $p'/p$ are sine and cosine of the same angle, $(p'/L)^2+(p'/p)^2=1$ or $(p\cdot p')^2+(L\cdot p')^2=(p\cdot L)^2$, rendering $p=(L\cdot p')/(L^2-p'^2)^{1/2}$. This value of p is the pitch of the memory cell array for a given pitch p' of the bitlines, which are preferably arranged according to a minimum pitch. In a typical example, the minimum bitline pitch is $p'=120$ nm and the dimension $L=110$ nm$+n\cdot 140$ nm, supposing the dimension of the relevant contact areas to be 150 nm, the width of each of n wordlines 100 nm, and each interstice between wordlines 40 nm. For different numbers n of cells that are provided in each NAND chain, the following table gives the cell pitch p and the corresponding relative increase $(p-p')/p'$ of the area of the cell array.

| n | p/nm | (p − p')/p' |
|---|------|-------------|
| 1 | 136.788 | 13.99% |
| 2 | 126.119 | 5.10% |
| 3 | 123.199 | 2.67% |
| 4 | 121.972 | 1.64% |
| 5 | 121.339 | 1.12% |
| 6 | 120.969 | 0.81% |
| 7 | 120.734 | 0.61% |
| 8 | 120.575 | 0.48% |
| 9 | 120.463 | 0.39% |
| 10 | 120.381 | 0.32% |

This table shows that n should be at least 3, in order to keep the increase of the area of the array under 5%, as compared to the first embodiment with straight bitlines.

Figure 11:
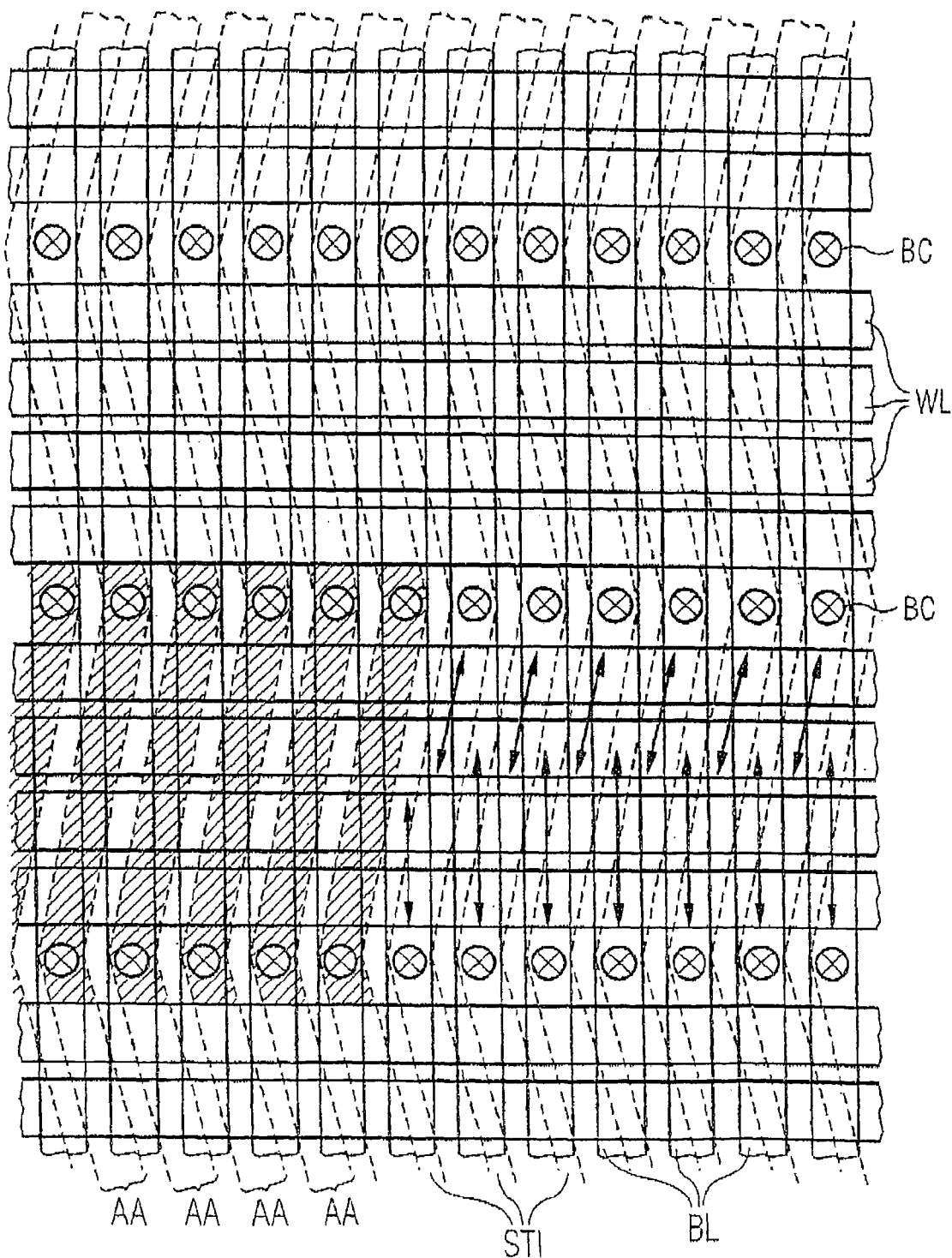
FIG. 11 is a plan view according to FIG. 8 of a further embodiment according to the circuit scheme of FIG. 7.

FIG. 11 is a plan view according to FIG. 8 for a further embodiment according to the circuit scheme of FIG. 7. In this embodiment, the active areas AA, in which the columns of memory cells are located, are arranged in zigzag fashion, while the bitlines are straight. The relative arrangement of the active areas AA, the bitlines BL, and the bitline connections BC is comparable to the embodiment of FIG. 10. It is also possible to have both the active areas and the bitlines deviate from the strictly straight arrangement, in order to be able to further minimize the required device area, according to the minimal pitch that can be realized by the process technology.

The different resistances of the electric connections to the different memory cells result in a larger distribution of the threshold voltages of the programmed memory cells. This can be compensated either by the number of programming pulses, combined with a verify operation, which consumes operation time, or by a local adaptation of the programming conditions. The latter possibility will be described in more detail. This method adapts the voltages during the write operation to the localization of the written memory cell within the NAND chain.

Figure 12:
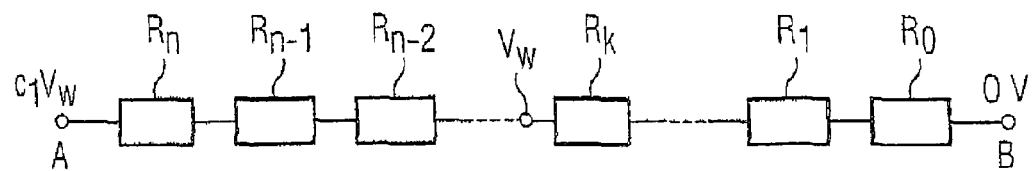
FIG. 12 shows a circuit diagram representing a NAND chain with a memory cell to be written.

FIG. 12 shows a circuit diagram representing a NAND chain between the connections A and B indicated in FIG. 4. The memory cells are enumerated in the direction from connection B to connection A by the numbers 0, 1, 2, ..., n−1, n, and are represented by their resistances $R_0$, $R_1$, $R_2$, ..., $R_n$. If the left storage site of memory cell number k, having resistance $R_k$, is to be programmed, for instance, the write voltage $V_w$ has to be applied to the left source/drain connection of the k-th memory cell, which is located on the side of connection A, and a floating potential has to be applied to the right source/drain connection of the k-th memory cell, which is located on the side of connection B. The floating potential at connection B can be regarded to be 0 V, which is the usual bitline voltage that is applied to the bitlines in the intervals between the write and read operations.

As the gate connection of the k-th memory cell is set to a negative potential, in the example to −7 V, this memory cell has a high resistance $R_k=R_{write}$. The other memory cells of this NAND chain are switched open by means of the high voltage of typically 5 V at their gate connections. Therefore, all the other resistances $R_0, R_1, R_2, \ldots, R_{k-1}, R_{k+1}, \ldots, R_n$ have low values, which can be taken to be the same average value, denoted in the following by $R_{average}$. The series of resistances shown in FIG. 12 functions as a potential divider between the connections A and B. In order to have the desired write voltage $V_w$ at the designated position of the storage site to be programmed, it is necessary to apply a larger voltage $c_1 V_w$ to connection A. The value of the constant $c_1$ can be calculated according to the standard laws of electric circuits.

Figure 13:
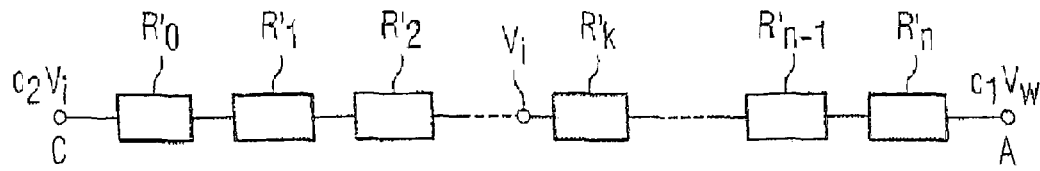
FIG. 13 shows a circuit diagram representing the mirror NAND chain corresponding to the NAND chain of FIG. 12.

FIG. 13 shows the mirror NAND chain between the connections A and C as indicated in FIG. 4. The mirror memory cells are enumerated in the direction from connection C to connection A by the numbers $0, 1, 2, \ldots, n-1, n$, and are represented by their resistances $R'_0, R'_1, R'_2, \ldots, R'_n$. The inhibit voltage $V_i$ has to be applied to the left-hand side of the k-th mirror memory cell, which is represented in the circuit diagram of FIG. 13 by its resistance $R'_k = R_{inhibit}$. The resistances $R'_0, R'_1, \ldots, R'_{k-1}, R'_{k+1}, \ldots, R'_n$ of the other mirror memory cells can be taken as equal to $R_{average}$. The constant $c_2$ can be calculated in a standard way in order to find the voltage that has to be applied to connection C, if the voltage $c_1 V_w$ is applied to connection A and the k-th memory cell of the mirror NAND cell has to be set to the inhibit voltage $V_i$.

The calculation is as follows. If $R_i$ denotes the resistance of the memory cell no. i, counted from connection B to connection A, i integer and $0 \leq i \leq n$, and $R'_i$ denotes the resistance of the mirror memory cell no. i on the opposite side of the connection A, counted in the opposite sense from connection C to connection A, let $$R = R_0 + R_1 + R_2 + \ldots + R_k + \ldots + R_{n-2} + R_{n-1} + R_n,$$

$$R_{i,j} = R_i + R_{i+1} + R_{i+2} + \ldots + R_{j-2} + R_{j-1} + R_j,$$

$$R' = R'_0 + R'_1 + R'_2 + \ldots + R'_k + \ldots + R'_{n-2} + R'_{n-1} + R'_n,$$
and $$R'_{i,j} = R'_i + R'_{i+1} + R'_{i+2} + \ldots + R'_{j-2} + R'_{j-1} + R'_j,$$

where i and j are integers and $0 \leq i \leq j \leq n$.

If cell no. k, $0 \leq k \leq n$, is to be programmed, and $V_w$ denotes the write voltage and $V_i$ the inhibit voltage, $$c_1 = R/R_{0,k} \text{ and } c_2 = (R' - c_0 \cdot R'_{0,k-1})/R'_{k,n} \text{ with } c_0 = c_1 \cdot V_w/V_i.$$

With the notation $R_k = R_{write}$, $R'_k = R_{inhibit}$ and the assumption $R_i = R'_i = R_{average}$ for $i \neq k$, $$c_1 = (R_{write} + n \cdot R_{average})/(R_{write} + k \cdot R_{average}) \text{ and }$$

$$c_2 = (R_{inhibit} + (n - c_0 \cdot k) \cdot R_{average})/(R_{inhibit} + (n-k) \cdot R_{average}).$$

This multi-bit memory device provides an arrangement of charge-trapping flash memory cells in a virtual-ground NAND array in different kinds of architecture. A preferred operation mode is applied to the structure and layout of the arrangement. The following advantages result from these features: the combination of charge-trapping flash memory cells in a virtual-ground NAND array enables an extremely high storage density; because of the positive threshold voltages, no selection transistor is necessary within the NAND chains, contrary to conventional NAND arrays; and the low power consumption, due to an operation mode on the basis of hot hole injection, enables the application of this memory device as a data memory.

Although the present invention and its advantages have been described in detail, it should be understood that various changes, substitutions and alterations can be made herein without departing from the spirit and scope of the invention as defined by the appended claims.

What is claimed is:

1. A memory cell arrangement, comprising:
   a first bit line;
   a second bit line;
   a third bit line;
   a first NAND memory cell string comprising a plurality of serially source-to-drain coupled non-volatile memory cells;
   a second NAND memory cell string comprising a plurality of serially source-to-drain coupled non-volatile memory cells;
   the first bit line being coupled to a source/drain region of a first non-volatile memory cell of the plurality of serially source-to-drain coupled non-volatile memory cells of the first NAND string;
   the second bit line being coupled to a source/drain region of a first non-volatile memory cell of the plurality of serially source-to-drain coupled non-volatile memory cells of the second NAND string; and
   the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string.

2. The memory cell arrangement of claim 1, the non-volatile memory cells being charge storage memory cells.

3. The memory cell arrangement of claim 2, the charge storage memory cells being charge trapping memory cells.

4. The memory cell arrangement of claim 1, the non-volatile memory cells being multi-bit non-volatile memory cells.

5. The memory cell arrangement of claim 4, further comprising the multi-bit non-volatile memory cells having at least two separate charge storage sites.

6. The memory cell arrangement of claim 1, further comprising:
   a plurality of word lines, each word line coupled to a control region of at least one non-volatile memory cell controlling the conduction state of the at least one non-valatile memory cell.

7. The memory cell arrangement of claim 6, further comprising:
   each word line coupled to a control region of a non-volatile memory cell of the plurality of serially source-to-drain coupled non-volatile memory cells of the first NAND string and to a control region of a non-volatile memory cell of the plurality of serially source-to-drain coupled non-volatile memory cells of the second NAND string.

8. The memory cell arrangement of claim 1, further comprising:
   a third NAND memory cell string comprising a plurality of serially source-to-drain coupled non-volatile memory cells;
   a fourth NAND memory cell string comprising a plurality of serially source-to-drain coupled non-volatile memory cells;
   the first bit line being coupled to a source/drain region of a first non-volatile memory cell of the plurality of serially source-to-drain coupled non-volatile memory cells of the third NAND string;

the second bit line being coupled to a source/drain region of a first non-volatile memory cell of the plurality of serially source-to-drain coupled non-volatile memory cells of the fourth NAND string; and the third bit line being coupled to a source/drain region of a last non-volatile memory cell of the plurality of serially source-to-drain coupled non-volatile memory cells of the third NAND string and to a source/drain region of a last non-volatile memory cell of the plurality of serially source-to-drain coupled non-volatile memory cells of the fourth NAND string.

9. The memory cell arrangement of claim 1,
the non-volatile memory cells having active areas including the source/drain regions;
the active areas having a zigzag structure.

10. The memory cell arrangement of claim 1, the first bit line, the second bit line and the third bit line having a zigzag structure.

11. The memory cell arrangement of claim 6, further comprising an electronic circuit for providing voltages to the word lines and the bit lines in read, write and erase operations.

12. The memory cell arrangement of claim 11, further comprising a write voltage applied to the third bit line and an inhibit voltage applied to the first bit line, such that a write operation at the non-volatile memory cells of the plurality of serially source-to-drain coupled non-volatile memory cells of the first NAND string is inhibited, or such that a write operation at the non-volatile memory cells of the plurality of serially source-to-drain coupled non-volatile memory cells of the second NAND string is inhibited.

13. The memory cell arrangement of claim 11, wherein the write voltages are applied to the bit lines and the word lines so as to write a non-volatile memory cell using hot hole injection.

14. The memory cell arrangement of claim 11, wherein erase voltages are applied to the bit lines and the word lines so as to erase the non-volatile memory cell using Fowler Nordheim tunneling.

15. The memory cell arrangement of claim 11, wherein
a read voltage applied to the bit lines and the word lines
forwards the content of a non-volatile memory cell of the plurality of serially source-to-drain coupled non-volatile memory cells of the first NAND string by detecting a current flow through the plurality of serially source-to-drain coupled non-volatile memory cells of the first NAND string; or
reads the content of a non-volatile memory cell of the plurality of serially source-to-drain coupled non-volatile memory cells of the second NAND string by detecting a current flaw through the plurality of serially source-to-drain coupled non-volatile memory cells of the second NAND string.

16. The memory cell arrangement of claim 1, wherein each bit line further comprises a select transistor for individually selecting the respective bit line.

17. The memory cell arrangement of claim 16, further comprising:
a first global bit line coupled to the first bit line and the second bit line via the select transistors of the first bit line and the second bit line, respectively;
a second global bit line coupled to the third bit line via the select transistor of the third bit line.

18. In a memory cell arrangement, comprising a first bit line, a second bit line, a third bit line, a first NAND memory cell sting comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, a plurality of word lines, each word line coupled to a control region of at least one non-volatile memory cell controlling the conduction state of the at least one non-volatile memory cell, a method of writing to said memory cell arrangement comprising: p1 applying a write voltage to the third bit line and an inhibit voltage to the first bit line, thereby inhibiting a write operation at the non-volatile memory cells of the plurality of serially source-to-drain coupled non-volatile memory cells of the first NAND string; and
applying a write voltage to the third bit line and an inhibit voltage to the first bit line, thereby inhibiting a write operation at the non-volatile memory cells of the plurality of serially source-to-drain coupled non-volatile memory cells of the second NAND string.

19. The method of claim 18, wherein applying the voltages are applied to the bit lines and the word lines so as to write a non-volatile memory cell using hot hole injection.

20. A method of erasing memory cells of a memory cell arrangement comprising, a first bit line, a second bit line, a third bit line, a first NAND memory cell string comprising a plurality of serially source-to-drain coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, and a plurality of word lines, each word line coupled to a control region of at least one non-volatile memory cell controlling the conduction state of the at least one non-volatile memory cell, the method comprising:
applying erase voltages to the bit lines and the word lines so as to erase the non-volatile memory cells using Fowler Nordheim tunneling.

21. A method of reading the content of a memory cell of a memory cell arrangement comprising a first bit line, a second bit line, a third bit line, a first NAND memory cell string comprising a plurality of serially source-to-drain, coupled non-volatile memory cells, a second NAND memory cell string comprising a plurality of serially source-to-drain coupled non-volatile memory cells, the first bit line being coupled to a source/drain region of a first non-volatile memory cell of the plurality of serially source-to-drain coupled non-volatile memory cells of the first NAND string, the second bit line being coupled to a source/drain region of a first non-volatile memory cell of the plurality of serially source-to-drain coupled non-volatile memory cells of the second NAND string, the third bit line being coupled to a source/drain region of a last non-volatile memory cell of the plurality of serially source-to-drain coupled non-volatile memory cells of the first NAND string and to a source/drain region of a last non-volatile memory cell of the plurality of serially source-to-drain coupled non-volatile memory cells of the second NAND string, a plurality of word lines, each word line coupled to a control region of at least one non-volatile memory cell controlling the conduction state of the at least one non-volatile memory cell, the method comprising:

applying read voltages to the bit lines and the word lines so as to read the content of a non-volatile memory cell of the plurality of serially source-to-drain coupled non-volatile memory cells of the first NAND string by detecting a current flow through the plurality of serially source-to--drain coupled non-volatile memory cells of the first NAND string; and applying read voltages to the bit lines and the word lines so as to read the content of a non-volatile memory cell of the plurality of serially source-to-drain coupled non-volatile memory cells of the second NAND string by detecting a current flow through the plurality of serially source-to-drain coupled non-volatile memory cells of the second NAND string.

\* \* \* \* \*